(12) United States Patent
Kurisaki et al.

(10) Patent No.: US 6,372,403 B1
(45) Date of Patent: Apr. 16, 2002

(54) PHOTOSENSITIVE RESIN COMPOSITION

(75) Inventors: Minoru Kurisaki; Takamasa Harada, both of Ogasa-gun (JP); Takanori Kudo, Somerville, NJ (US); Takashi Takeda, Ogasa-gun; Junichi Fukuzawa, Tokyo, both of (JP)

(73) Assignee: Clariant Finance (BVI) Limited, Tortola (VG)

( * ) Notice: Subject to any disclaimer, the term of this patent is extended or adjusted under 35 U.S.C. 154(b) by 0 days.

(21) Appl. No.: 09/623,119

(22) PCT Filed: Dec. 22, 1999

(86) PCT No.: PCT/JP99/07232

§ 371 Date: Nov. 15, 2000

§ 102(e) Date: Nov. 15, 2000

(87) PCT Pub. No.: WO00/39639

PCT Pub. Date: Jul. 6, 2000

(30) Foreign Application Priority Data

Dec. 25, 1998 (JP) ............................. 10-371083

(51) Int. Cl.$^7$ ............................. G03F 7/023; G03F 7/30

(52) U.S. Cl. .................. 430/191; 430/165; 430/190; 430/192; 430/193; 430/325

(58) Field of Search ................... 430/191, 192, 430/193, 190, 165, 325

(56) References Cited

U.S. PATENT DOCUMENTS 4,308,368 A * 12/1981 Kubo et al. .................. 525/524
5,650,261 A * 7/1997 Winkle .................... 430/270.1

* cited by examiner

*Primary Examiner*—John S. Chu
(74) *Attorney, Agent, or Firm*—Krishna Banerjee

(57) ABSTRACT

A photosensitive resin composition comprising (a) a photosensitizer having in its structure 1,2-diazidonaphthoquinone structure, and a methylene-bridged structure composed of two or more methyl-substituted phenol derivatives, (b) a polymer having both hydroxyl group and carboxyl group, or a combination of a polymer having hydroxyl group and one having carboxyl group, (c) a crosslinking agent capable of crosslinking hydroxyl group and carboxyl group, and (d) a solvent. This composition can form highly transparent films, and, in addition, patterns having high contrast can be obtained when this composition is used as a photoresist.

9 Claims, No Drawings

PHOTOSENSITIVE RESIN COMPOSITION

BACKGROUND OF THE INVENTION

1. Field of the Invention

The present invention relates to a photosensitive resin composition. More particularly, the present invention relates to a photosensitive resin composition useful for forming protective or insulating films for, for example, semiconductor devices, flat panel displays, liquid crystal devices, and especially for color filters and thin film transistors (hereinafter referred to as "TFTs") etc.

2. Related Art

Heretofore, mixtures of novolak resins and diazidonaphthoquinone have generally been used as positive photoresists useful in the production of flat panel displays (hereinafter referred to as "FPDs") or semiconductor devices. However, films formed by using these mixtures are sometimes insufficient in transparency. In case these films are intended to use as protective or insulating films which are applied to the surfaces of semiconductor devices, FPDs or liquid crystal devices, such insufficient transparency causes disadvantageousness. In particular, some problems occur due to such insufficient transparency when these films are used for such devices as color filters or TFTs through which light is allowed to pass. Why these conventional photoresist films cannot have sufficiently high transparency is chiefly due to the nature of novolak resins used as resin components in the photoresists. In case high transparency is required for such films, acrylic or polyhydroxystyrene (hereinafter referred to as "PHS") resins which can give films having higher transparency have been used. However, even in this case, some improvements other than its transparency are needed.

Namely, since acrylic or PHS resins are poor in compatibility with copolymers of benzophenone compounds and 1,2-diazidonaphthoquinone, which are photosensitizers usually used in photoresists to be used for the above-described purposes, it is sometimes difficult to obtain high contrast between exposed area and unexposed area after development.

Therefore, photosensitive resin compositions capable of forming films having sufficiently high transparency, and of imparting satisfactorily high contrast to images to be formed in the films after development are still needed.

SUMMARY OF THE INVENTION

A photosensitive resin composition of the present invention comprises the following components:

(a) a photosensitizer having in its structure 1,2-diazidonaphthoquinone structure, and a methylene-bridged structure composed of two or more methyl-substituted phenol derivatives;

(b) a polymer having both hydroxyl group and carboxyl group, or a combination of a polymer having hydroxyl group and a polymer having carboxyl group;

(c) a crosslinking agent capable of crosslinking hydroxyl group and carboxyl group; and (d) a solvent.

Further, an article of the present invention comprises a protective or insulating film made from the aforementioned photosensitive resin composition.

Moreover, a method for forming patterns of the present invention comprises the following process;

(a) a process for coating the aforementioned photosensitive resin composition on a substrate, (b) a process for exposing the coated photosensitive resin composition on the substrate for making an image on it; and (c) a process for developing the exposed photosensitive resin composition on the substrate.

Furthermore, an another aspect of the present invention is an use of the aforementioned photosensitive resin composition for manufacturing a protective or insulating film.

By using the photosensitive resin composition of the present invention, it is possible to obtain films having high transparency. Moreover, patterns having high contrast can be obtained when the composition of the invention is used as a photoresist.

DETAILED DESCRIPTION OF THE INVENTION

1. Photosensitizer

The photosensitizer for use in the photosensitive resin composition of the present invention has in its structure 1,2-diazidonaphthoquinone structure and a methylene-bridged structure composed of two or more methyl-substituted phenol derivatives. In general, methyl-substituted phenol derivatives are phenol derivatives in which any of hydrogens attached to carbons on phenol structure is substituted with methyl group. However, in the present invention, they also encompass those compounds which are not substituted with methyl group, that is, phenols themselves. Therefore, the methylene-bridged structure composed of two or more methyl-substituted phenol derivatives can be defined as a structure in which two or more phenol structures are connected by methylene group, and any of hydrogens on the phenol structure is substituted with methyl group.

In the present invention, the photosensitizer has in its structure two or more methyl-substituted phenol derivatives; and the number of the methyl-substituted phenol derivatives present in the structure is preferably from 2 to 5, particularly 4.

In the present invention, the photosensitizer may contain a plurality of 1,2-diazidonaphthoquinone structures. It is enough that at least one 1,2-diazidonaphthoquinone structure is present in the structure of the photosensitizer. However, this structure can exist in any number, the maximum number being equal to the number of hydroxyl groups present in the methylene-bridged structure composed of methyl-substituted phenol derivatives; the number is preferably from 1 to 5, particularly from 2 to 4.

Of photosensitizers fulfilling the above-described requirements, those ones represented by the following formulae are particularly preferred as the photosensitizer for use in the photosensitive resin composition of the present invention:

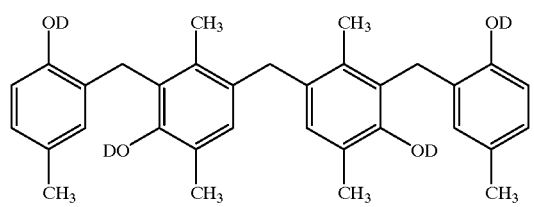

-continued

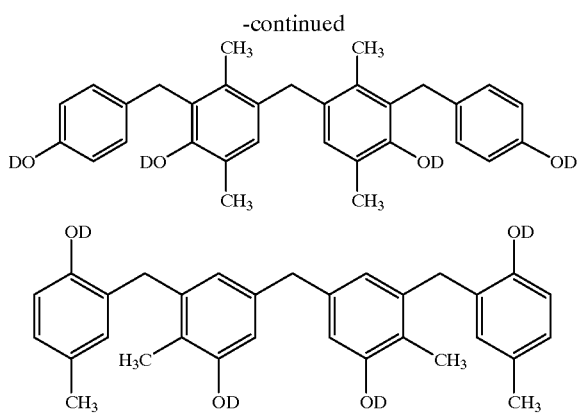

wherein D is

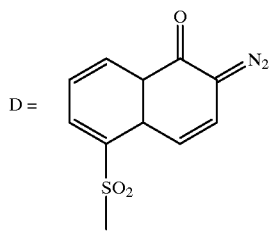

or H, provided that at least one of Ds present in each formula is not H.

Of the photosensitizers re presented by the above formulae, those ones in which three of four Ds are esterified with 1,2-diazidonaphthoquinonesulfonic acid are most preferred.

Such photosensitizers can be obtained by condensation polymerization reaction between methylene-bridged products of methyl-substituted phenol derivatives and compounds having 1,2-diazidonaphthoquinone structure; and polymers obtained in this manner are preferred.

Any methyl-substituted phenol derivative and any compound having 1,2-diazidonaphthoquinone structure can be used for the condensation polymerization as long as they can give, when condensation-polymerized, a photosensitizer that can be used for the photosensitive resin composition of the present invention. Further, this condensation polymerization reaction can be carried out by any conventional method.

Examples of compounds having 1,2-diazidonaphthoquinone structure that can be subjected to the above condensation polymerization include 1,2-diazidobenzoquinonesulfonic ester, 1,2-diazidonaphthoquinonesulfonic ester, 1,2-diazidobenzoquinonesulfonamide, and 1,2-diazidonaphthoquinonesulfonamide. More specifically, the following compounds can be mentioned: phenyl 1,2-diazidobenzoquinone-4-sulfonate, 1,2,1'1,2'-di-(diazidobenzoquinone-4-sulfonyl)-dihydroxybiphenyl, 1,2-diazidobenzoquinone-4-(N-ethyl-N-β-naphthyl)-sulfonamide, cyclohexyl 1,2-diazidonaphthoquinone-5-sulfonate, 1-(1,2-diazidonaphthoquinone-5-sulfonyl) -3,5-dimethylpyrazole, 1,2-diazidonaphthoquinone-5-sulfonic acid-4'-hydroxy-diphenyl-4"-azo-β-naphthol ester, N,N-di-(1,2-diazidonaphthoquinone-5-sulfonyl)-aniline, 2'-(1,2-diazidonaphthoquinone-5-sulfonyloxy)-1-hydroxyanthraquinone, 1,2-diazidonaphthoquinone-5-sulfonic acid-2,3,4-trihydroxy-benzophenone ester, 1,2-diazidonaphthoquinone-5-(N-dihyroabietyl)sulfonamide, a condensation product of 1,2-diazidonaphthoquinone-5-sulfonic acid chloride(2 moles) and 4,4'-diaminobenzophenone (1 mole), a condensation product of 1,2-diazidonaphthoquinone-5-sulfonic acid chloride (2 moles) and 4,4'-dihydroxy-1,1'-diphenylsulfone (1 mole), and a condensation product of 1,2-diazidonaphthoquinone-5-sulfonic acid chloride (1 mole) and purpurogallin (1 mole). In addition, the compounds having 1,2-diazidonaphthoquinone structure described in the following documents may also be used: Japanese Patent Publications No. 1953/1962, No. 3627/1962, No. 13109/1962, No. 26126/1965, No. 3801/1965, No. 5604/1970, No. 27345/1970 and No. 13013/1976; Japanese Patent Laid-Open Publications No. 96575/1973, No. 63802/1973 and No. 63803/1973; J. Kosar, "Light-Sensitive Systems", 339–352 (1965), John Wiley & Sons, New York, U.S.A.; W. S. De Forest, "Photoresist", 50 (1975), McGraw-Hill, Inc., New York, U.S.A., and the like. (These documents are cited as a part of disclosures of this specification.)

Examples of methylene-bridged products of methyl-substituted phenol derivatives that can be used for the above-described condensation polymerization include bisparacresol-bis-2,5-xylenol, bisphenol-bis-2,5-xylenol and bisparacresol-bis-orthocresol etc.

Two or more of these photosensitizers may be used in combination, if necessary. Moreover, photosensitizers not included in the above-described categories can also be used in combination with the above photosensitizers within such limits that the effects of the invention will not be marred.

The percentage of the photosensitizer in the photosensitive resin composition of the present invention is from 3 to 50%, preferably from 5 to 35% of the weight of the polymer contained in the photosensitive resin composition. By using the photosensitizer within the above-described range, it is possible to obtain a sufficient sensitivity and a satisfactory resolution.

2. Polymer

The photosensitive resin composition of the present invention comprises as its binder an alkali-soluble polymer.

In a first embodiment of the present invention, the photosensitive resin composition comprises as the alkali-soluble polymer a polymer having both hydroxyl group and carboxyl group. Any polymer of this type can be used for the photosensitive resin composition of the present invention. However, the OH value of the polymer is preferably from 10 to 180, more preferably from 50 to 120; and the acid value of the polymer is preferably from 10 to 200, more preferably from 30 to 150.

Further, the polymer for use in the photosensitive resin composition of the present invention is preferably an acrylic or polyhydroxystyrene polymer. These polymers can be obtained by using as a monomer an acrylic acid derivative or hydroxystyrene derivative.

Such a polymer can be obtained by copolymerizing an unsaturated monomer having hydroxyl group (A1) and a monomer having carboxyl group (A2), or by homopolymerizing a monomer having both hydroxyl group and carboxyl group (A). A monomer (B) other than these monomers may also be copolymerized as needed.

Examples of monomers having hydroxyl group (A1) include hydroxystyrene derivatives, hydroxyalkyl (meth) acrylate derivatives and vinyl alcohol derivatives etc. Specific examples of such monomers include hydroxystyrene, hydroxymethyl (meth)acrylate, 2-hydroxyethyl (meth) acrylate, 2-hydroxypropyl (meth)acrylate and vinyl alcohol etc.

It is herein noted that (meth)acrylate means both acrylate and methacrylate and that (meth)acrylic acid means both acrylic acid and methacrylic acid.

Examples of monomers having carboxyl group (A2) include α,β-ethylenically unsaturated carboxylic acid derivatives. In the present invention, the carboxyl group is one derived from any of monocarboxylic acids, dicarboxylic acids, acid anhydrides, monoesters of dicarboxylic acids, and diesters of dicarboxylic acids. Specific examples of these compounds include acrylic acid, methacrylic acid, crotonic acid, maleic acid, fumaric acid, citraconic acid, mesaconic acid, itaconic acid, monomethyl maleate, monomethyl fumarate, monoethyl citraconate, maleic anhydride, itaconic anhydride, monoethyl maleate, monoethyl fumarate, monoethyl itaconate, diethyl maleate, diethyl fumarate and diethyl itaconate etc.

Examples of monomers having both hydroxyl group and carboxyl group (A) include hydroxyalkyl (meth)acrylic acids, specifically β-oxy(meth)acrylic acid etc.

Any monomer can be selected, within such limits that the effects of the present invention will not be marred, for the monomer (B) that may be copolymerized with the above-described monomers when necessary. Examples of such monomers include styrene derivatives, (meth)acrylate derivatives (e.g., alkyl (meth)acrylate, cycloalkyl (meth)acrylate, aryl (meth)acrylate, etc.), monoolefinic unsaturated compounds, and conjugated diolefinic hydrocarbons etc. Specific examples of these monomers include styrene, α- or β-methylstyrene, o-, m- or p-methylstyrene, p-methoxystyrene, (meth) acrylonitrile, vinyl chloride, vinylidene chloride, (meth)acrylamide, vinyl acetate, methyl (meth)acrylate, ethyl (meth)acrylate, n-, sec- or tert-butyl (meth)acrylate, iso-propyl (meth)acrylate, cyclohexyl (meth)acrylate, 2-methylcyclohexyl (meth)acrylate, phenyl (meth)acrylate, benzyl (meth)acrylate, 1,3-butadiene, chloroprene, isoprene and dimethylbutadiene etc.

Monomers having hydroxyl group itself and/or carboxyl group itself have been exemplified as monomers useful for obtaining the polymer for use in the present invention. However, the polymer may also be produced by copolymerizing or homopolymerizing monomers whose hydroxyl and/or carboxyl group is protected by a protective group, thereby obtaining a polymer, and then removing the protecting group to finally obtain the desired polymer having hydroxyl group and/or carboxyl group. In this case, monomers that can be the source of carboxyl or hydroxyl group may be used as the monomer (B). For instance, a copolymer having carboxyl group can be obtained by hydrolyzing a methyl methacrylate copolymer.

In a second embodiment of the present invention, the photosensitive resin composition comprises as the alkali-soluble polymer a polymer having hydroxyl group and a polymer having carboxyl group. A combination of any polymer having hydroxyl group and any polymer having carboxyl group can be used for the second photosensitive resin composition of the present invention. However, the OH value of the polymer having hydroxyl group is preferably from 10 to 180, more preferably from 50 to 120; and the acid value of the polymer having carboxyl group is preferably from 10 to 200, more preferably from 30 to 150.

These polymers can be obtained by polymerizing monomers that can be used for producing the above-described polymer for use in the photosensitive resin composition. Namely, a polymer having hydroxyl group can be obtained by homopolymerizing the above-described monomer having hydroxyl group (A1), or by copolymerizing the monomer (A1) and the above-described monomer (B); and a polymer having carboxyl group can be obtained by homopolymerizing the above-described monomer having carboxyl group (A2), or by copolymerizing the monomer (A2) and the monomer (B).

There is no particular limitation on the molecular weight of the polymer for use in the photosensitive resin composition of the present invention. However, the weight-average molecular weight of the polymer is generally from 5,000 to 100,000, preferably from 5,000 to 40,000.

In the first or second photosensitive resin composition of the present invention, a combination of two or more resin compositions can be used. Further, polymers other than the resin compositions may be incorporated into the resin compositions when necessary.

The polymer content of the photosensitive resin composition of the present invention is from 3 to 80%, preferably from 10 to 35% of the total weight of the photosensitive resin composition. When the polymer content is within the above-described range, a sufficiently hardened film is obtained after development, and also a satisfactorily high contrast is obtained after development.

3. Crosslinking Agent

The photosensitive resin composition of the present invention comprises a crosslinking agent. This crosslinking agent serves to crosslink hydroxyl group and carboxyl group present in the polymer used. By this crosslinking reaction which occurs during post baking (which will be described later in detail) to be usually conducted after development, the photosensitive resin composition of the present invention is finally hardened to give a film having sufficiently high strength.

Such a crosslinking agent can be selected from conventional crosslinking agents, for example, those of epoxy type, isocyanate type, phenol type or amine type, and acid anhydrides.

Specific examples of useful crosslinking agents include bisphenol acetone diglycidyl ether, phenol novolak epoxy resins, cresol novolak epoxy resins, triglycidyl isocyanurate, tetraglycidyldiaminodiphenylene, tetraglycidyl-m-xylenediamine, tetraglycidyl-1,3-bis(aminoethyl)cyclohexane, tetraphenylglycidyl ether ethane, triphenyl glycidyl ether ethane, bisphenol hexafluoroacetodiglycidyl ether, 1,3-bis(1-(2,3-epoxypropoxy)-1-trifluoromethyl-2,2,2-trifluoromethyl)benzene, 4,4-bis(2,3-epoxypropoxy)octafluorobiphenyl, triglycidyl-p-aminophenol, tetraglycidylmetaxylenediamine, 2-(4-(2,3-epoxypropoxy)phenyl)-2-(4-(1,1-bis(4-(2,3-epoxy-propoxy)phenyl)ethyl)phenyl)propane, and 1,3-bis(4-(1-(4-(2,3-epoxypropoxy)phenyl)-1-(4-(1-(4-(2,3-epoxypropoxy-phenyl)-1-methylethyl)phenyl)ethyl)phenoxy)-2-propanol etc.

These crosslinking agents are used singly, and, if necessary, two or more of these crosslinking agents may be used in combination.

4. Solvent

A solvent is used for the photosensitive resin composition of the present invention in order to dissolve in the solvent the aforementioned photosensitizer, polymer and crosslinking agent, and other components that are added as needed. Any purposive solvent can be used as this solvent, and a solvent selected from glycol ethers, cellosolve esters, aromatic hydrocarbons, ketones, propylene glycols and esters is generally used.

Specific examples of useful organic solvents include propylene glycol methyl ether, propylene glycol ethyl ether, propylene glycol propyl ether, propylene glycol t-butyl ether, dipropylene glycol methyl ether, dipropylene glycol propyl ether, tripropylene glycol methyl ether, propylene glycol methyl ether acetate, dipropylene glycol methyl ether acetate, ethylene glycol ethyl ether, ethylene glycol methyl ether, ethylene glycol butyl ether, ethylene glycol isopropyl ether, ethylene glycol n-butyl ether, diethylene glycol methyl ether, diethylene glycol ethyl ether, diethylene glycol butyl ether, diethylene glycol dimethyl ether, diethylene glycol diethyl ether, diethylene glycol monoacetate, diethylene glycol monoethyl ether acetate, propylene glycol phenyl ether, propylene glycol ethyl ether acetate, triethylene glycol butyl ether, cellosolve acetate, methyl cellosolve acetate, ethyl cellosolve acetate, 3-methyl-3-methoxybutyl acetate, 3-methyl-3-methoxybutanol, ethyl lactate, methyl lactate, butyl lactate, pentyl lactate, butyl acetate, amyl formate, isoamyl acetate, isobutyl acetate, methoxybutyl acetate, butyl propionate, isobutyl lactate, butyl lactate, ethyl pyruvate, toluene, xylene, methyl ethyl ketone and cyclohexanone.

These solvents can be used either singly or in combination of two or more members.

5. Photosensitive Resin Composition

The photosensitive resin composition of the present invention can be prepared by adding to and dissolving in the solvent the above-described photosensitizer, polymer and crosslinking agent, and, if necessary, additives such as surface active agents, alkali-dissolution promoters, alkali-dissolution inhibitors and antioxidants. These components can be added to the solvent in any order. Moreover, the photosensitive resin composition may also be prepared by separately dissolving the components in different solvents, and mixing the resulting solutions upon use. Further, although stirring is generally used to dissolve the components in the solvent, any other means such as the application of ultrasound may be employed in combination with stirring.

The photosensitive resin composition of the present invention can be applied to the surface of a substrate by any conventional method. Specifically, the photosensitive resin composition of the present invention can be applied by means of spray coating, roll coating, spin coating, dip coating, curtain coating or the like. There is no particular limitation on the substrate to be coated with the photosensitive resin composition of the present invention. Examples of useful substrates include semiconductor devices, color filters, TFTs, glass, glass filters, black matrixes, a variety of polymers (e.g., polyimide, polyamide, polyethylene, acrylic resins, etc.), silicon nitride, metallic oxides (titanium oxide, silicon oxide, chromium oxide, indium titanium oxide, etc.), and metals (e.g., aluminum, copper, etc.).

In general, the photosensitive resin composition of the present invention applied to the substrate is then subjected to pre-baking. The purpose of this pre-baking treatment is to remove all of or part of the solvent contained in the photosensitive resin composition film formed on the substrate. By this treatment, the photosensitive resin composition film is fixed to the substrate, so that the film is prevented from separating from the substrate during the succeeding light exposure and development treatments. The pre-baking treatment can be conducted under any condition as long as the above-described purpose can be attained. In general, however, this treatment is conducted by heating the photosensitive resin composition film at a temperature of 50 to 120° C. for 30 seconds to 2 minutes.

After conducting the pre-baking treatment, the photosensitive resin composition film provided on the substrate is exposed to actinic rays having a wavelength at which the photosensitizer is sensitive. Ultraviolet light with a wavelength of 250 to 500 nm is usually used as the actinic rays. It is preferable to use as this ultraviolet light i- or g-line emitted by a mercury vapor lamp, and i-line are particularly preferred. Further, the amount of light energy to be applied during this exposure is so controlled that crosslinking reaction can fully proceed in the exposed area, and it is generally in the range of 10 to 500 $mJ/cm^2$.

The exposure can be conducted by any conventional method; for example, exposure through a photomask, scanning exposure using a stepper, or the like can be used.

In general, the photosensitive resin composition film that has been exposed to light is then developed by an alkaline solution. By this development, the area on the photosensitive resin composition film that has been exposed to actinic rays is removed, and a positive image can thus be obtained. Any conventional developer useful for developing photoresists can be herein used. In general, an aqueous solution of an inorganic alkaline compound, primary amine, secondary amine, tertiary amine, alcohol amine or quaternary ammonium salt is used. More specifically, an aqueous solution of tetramethylammonium hydride (hereinafter referred to as "TMAH"), potassium hydroxide, sodium hydroxide, sodium carbonate, sodium silicate, ammonia, ethylamine, n-propylamine, diethylamine, di-n-propylamine, triethanolamine, dimethylethanolamine, tetramethylammonium, tetraethylammonium or choline can be used as the developer. Further, any additive selected from water-soluble organic solvents (specifically, methanol, ethanol, etc.), surface active agents and the like may be added to the developer, if necessary.

In general, the photosensitive resin composition film that has been developed is then subjected to post-baking. The purpose of this post-baking treatment is to obtain a sufficiently hardened positive image in a desired shape by heating the photosensitive resin composition film remaining on the substrate after development. The post-baking treatment can be conducted under any condition as long as the above purpose can be attained. However, the post-baking treatment is generally conducted by treating the photosensitive resin composition film at a temperature of 100 to 250° C. for 30 minutes to 2 hours.

An ordinary method for forming a positive image by using the photosensitive resin composition of the present invention has been described hereinbefore. In addition to the above-described treatments included in this method, other treatments usually used for treating photoresists, for instance, washing and drying of a photosensitive resin composition film may optionally be conducted.

Films formed in the aforementioned manner by using the photosensitive resin composition of the present invention have extremely high transparency. Moreover, images or patterns formed in these films have satisfactorily high contrast. Therefore, the films made from the photosensitive resin composition of the present invention can be used similarly as in the case of conventional photoresist films. In addition, by utilizing their advantageous properties, these films can suitably be used, for example, as protective-insulating films for semiconductor devices, liquid crystal devices, FPDs or the like, as protective films for color filters, and as protective or insulating films for TFTs.

The present invention will now be described more specifically by referring to the following examples, which are given for illustration of the invention and are not intended to be limiting thereof.

EXAMPLES

1. Evaluation of Contrast

Each photosensitizer listed in Table 1 was mixed with an acrylic resin ("PB2008" manufactured by Mitsubishi Rayon Co., Ltd., Japan, a resin having both hydroxyl group and carboxyl group), a crosslinking agent ("Coronate 2513" manufactured by Nippon Polyurethane Industry Co., Ltd., Japan, an isocyanate crosslinking agent), and a solvent (propylene glycol methyl ether acetate), and the mixture was stirred to obtain photosensitive resin compositions of Example 1 and of Comparative Example 1. Further, only the acrylic resin was dissolved in the solvent without adding any photosensitizer, thereby obtaining a resin composition of Comparative Example 2.

TABLE 1

| Example 1 | Polycondensation product of a methylene-bridged product of methyl-substituted phenol derivatives and a diazidonaphthoquinone monomer ("NK240" manufactured by Nippon Zeon Co., Ltd., Japan) |
| --- | --- |
| Comparative Example 1 | Polycondensation product of a benzophenone monomer and a diazidonaphthoquinone monomer ("4NT-350" manufactured by Toyo Gosei Co., Ltd., Japan) |
| Comparative Example 2 | (used no photosensitizer) |

Each resin composition obtained was applied to a 4-inch silicon wafer by a spin coating method using a spinner to obtain a film having a thickness of 20,000 angstroms. Subsequently, the wafers coated with the resin compositions were placed on a hot plate, and pre-baked at 100° C. for 1 minute. The thickness of each photosensitive resin composition film was measured.

Next, the photosensitive resin composition films were exposed to light of 200 mJ/cm$^2$ by using an aligner, and then developed by a dipping method using as the developer a 0.238% aqueous TMAH solution. After drying the films, the thickness of each film in the exposed area was measured to determine the decrease in film thickness. Further, each photosensitive resin composition film unexposed to light was developed in the same manner, and the decrease in film thickness in the unexposed area was determined. The results obtained are as shown in Table 2.

TABLE 2

| | Decrease in Film Thickness After Development (unit: angstrom) | |
| --- | --- | --- |
| | Unexposed Area | Exposed Area |
| Example 1 | 200 | 20,000 |
| Comparative Example 1 | 8,000 | 20,000 |
| Comparative Example 2 | 10,000 | 10,000 |

The results shown in Table 2 demonstrate the following: the photosensitive resin composition of the present invention (Example 1) in which a polycondensation product of a methylene-bridged product of methyl-substituted phenol derivatives and diazidonaphthoquinone is used as the photosensitizer shows a small decrease in film thickness in the unexposed area and a great decrease in film thickness in the exposed area, so that a pattern with high contrast can be formed in a film made from this composition.

2. Evaluation of Transparency

For comparison, photosensitive resin compositions were prepared in the same manner as in the above-described examples except that a novolak resin ("ALNOVAL 429" manufactured by Clariant GmbH) was used as the resin and that a polycondensation product of a benzophenone monomer and a diazidonaphthoquinone monomer, or a polycondensation product of a methylene-bridged product of methyl-substituted phenol derivatives and a diazidonaphthoquinone monomer was used as the photosensitizer.

Each photosensitive resin composition obtained was applied to a 4-inch silicon wafer by a spin coating method using a spinner, thereby obtaining a film having a thickness of 20,000 angstroms. Subsequently, the wafers coated with the compositions were placed on a hot plate, and pre-baked at 100° C. for 1 minute. Thereafter, the pre-baked wafers were subjected to development in the same manner as in the above-described examples without subjecting them to light exposure. The developed wafers were then exposed to light of approximately 200 mJ/cm$^2$ by using an aligner, and post-baked at 220° C. for 1 hour.

The percent transmissions at 400 to 800 nm of these photosensitive resin composition films were measured by a conventional method. Both of these films showed a percent transmission of approximately 90%. On the contrary, the percent transmission of the photosensitive resin composition film of Example 1 (after subjected to post-baking) was found to be more than 95%. These results demonstrate that the photosensitive resin composition of the present invention can give a highly transparent film.

What is claimed is:

1. A photosensitive resin composition comprising the following components:

a photosensitizer having in its structure 1,2-diazidonaphthoquinone structure, and a methylene-bridged structure composed of two or more methyl-substituted phenol derivatives;

a polymer having both hydroxyl group and carboxyl group, or a combination of a polymer having hydroxyl group and a polymer having carboxyl group:

a crosslinking agent capable of crosslinking hydroxyl group and carboxyl group; and a solvent;

wherein the photosensitizer is selected from the group consisting of compounds having the following formulae (I), (II) and (III):

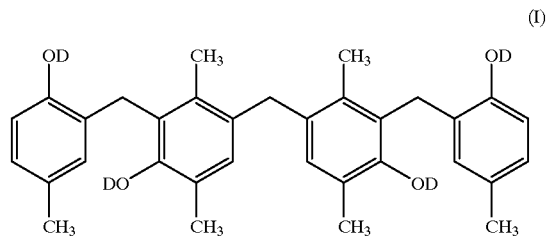

(I)

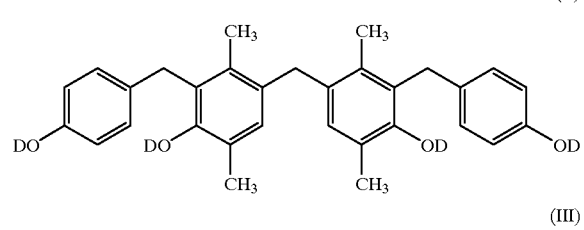

(II)

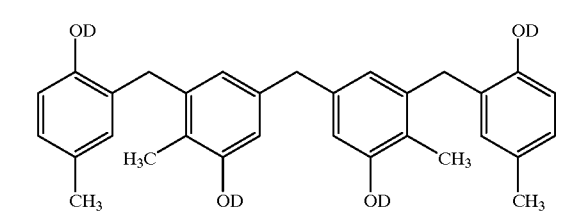

(III)

wherein D is

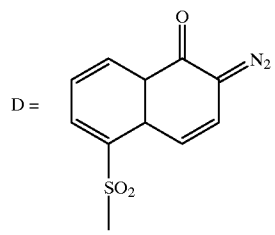

or H, provided that at least one of Ds present in each formula is not H.

2. A photosensitive resin composition according to claim 1, wherein the polymer having hydroxyl group has an OH value of 10 to 180.

3. A photosensitive resin composition according to claim 1, wherein the polymer having carboxyl group has an acid value of 10 to 200.

4. A photosensitive resin composition according to claim 1, wherein the polymer is produced by polymerizing a monomer having both hydroxyl group and carboxyl group.

5. A photosensitive resin composition according to claim 1, wherein the polymer is produced by copolymerizing a monomer having hydroxyl group and a monomer having carboxyl group.

6. A photosensitive resin composition according to claim 1, wherein the polymer is an acrylic or polyhydroxystyrene polymer.

7. An article comprising a protective or insulating film made from a photosensitive resin composition comprising the following components:
- a photosensitizer having in its structure 1,2-diazidonaphthoquinone structure, and a methylene-bridged structure composed of two or more methyl-substituted phenol derivatives;
- a polymer having both hydroxyl group and carboxyl group, or a combination of a polymer having hydroxyl group and a polymer having carboxyl group;
- a crosslinking agent capable of crosslinking hydroxyl group and carboxyl group; and a solvent;

wherein the photosensitizer is selected from the group consisting of compounds having the following formulae (I), (II) and (III):

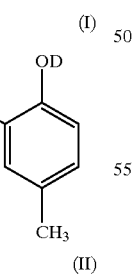

(I)

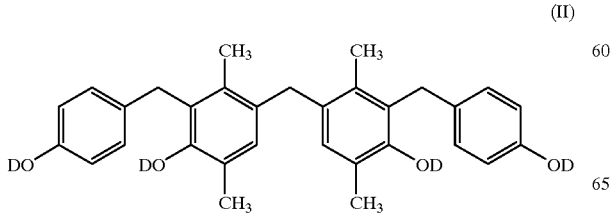

(II)

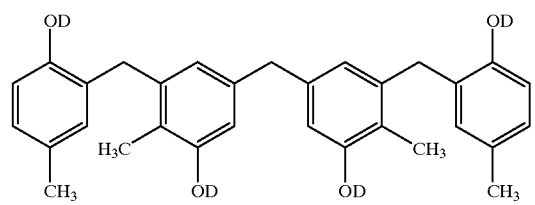

(III)

wherein D is

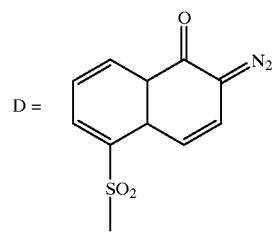

or H, provided that at least one of Ds present in each formula is not H.

8. A method for forming patterns comprising:

(a) coating a photosensitive resin composition comprising the following components on a substrate;
- a photosensitizer having in its structure 1,2-diazidonaphthoquinone structure, and a methylene-bridged structure composed of two or more methyl-substituted phenol derivatives;
- a polymer having both hydroxyl group and carboxyl group, or a combination of a polymer having hydroxyl group and a polymer having carboxyl group;
- a crosslinking agent capable of crosslinking hydroxyl group and carboxyl group; and a solvent;

wherein the photosensitizer is selected from the group consisting of compounds having the following formulae (I), (II) and (III):

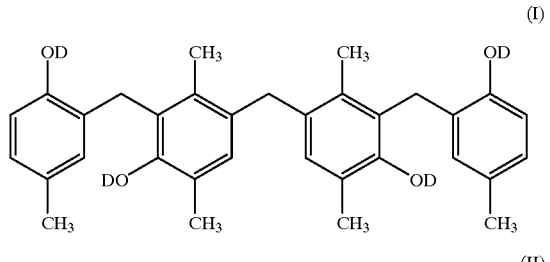

(I)

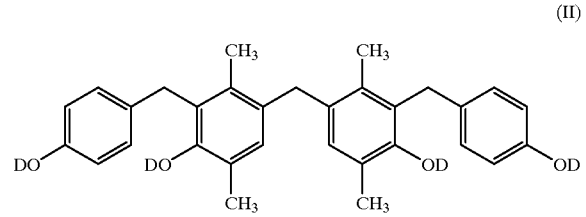

(II)

-continued (III)

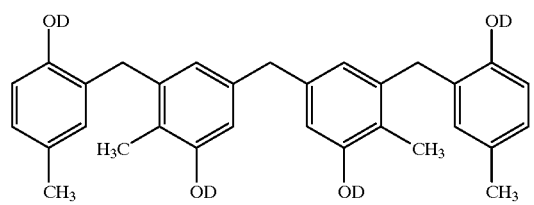

wherein D is

D = 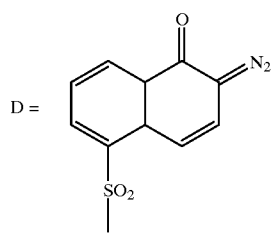

or H, provided that at least one of Ds present in each formula is not H;
(b) exposing the coated photosensitive resin composition on the substrate for making an image on it; and
(c) developing the exposed photosensitive resin composition on the substrate.

9. A process for manufacturing a protective or insulating film, comprising
providing a photosensitive sensitive resin composition comprising the following components:
a photosensitizer having in its structure 1,2-diazidonaphthoquinone structure, and a methylene-bridged structure composed of two or more methyl-substituted phenol derivatives;
a polymer having both hydroxyl group and carboxyl group, or a combination of a polymer having hydroxyl group and a polymer having carboxyl group;
a crosslinking agent capable of crosslinking hydroxyl group and carboxyl group; and a solvent;
wherein the photosensitizer is selected from the group consisting of compounds having the following formulae (I), (II) and (III):

(I)

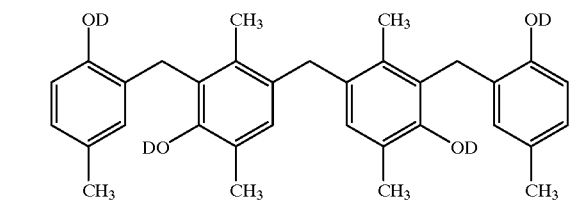

(II)

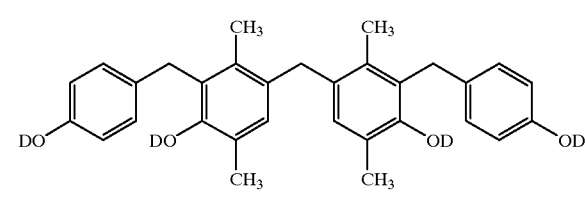

(III)

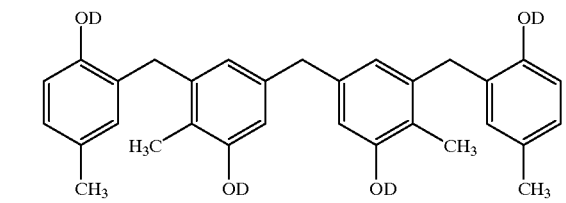

wherein D is

D = 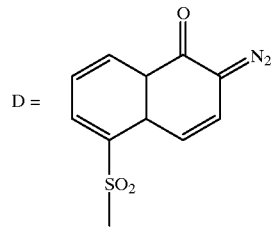

or H, provided that at least one of Ds present in each formula is not H.

* * * * *